US010741255B1

(12) United States Patent
Huang

(10) Patent No.: US 10,741,255 B1
(45) Date of Patent: Aug. 11, 2020

(54) SENSE AMPLIFIER REUSING SAME ELEMENTS FOR EVALUATING REFERENCE DEVICE AND MEMORY CELLS

(71) Applicant: GLOBALFOUNDRIES INC., Grand Cayman (KY)

(72) Inventor: Yentsai Huang, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/526,196

(22) Filed: Jul. 30, 2019

(51) Int. Cl.
*G11C 16/24* (2006.01)
*G11C 11/16* (2006.01)

(52) U.S. Cl.
CPC .......... *G11C 16/24* (2013.01); *G11C 11/1655* (2013.01); *G11C 11/1673* (2013.01)

(58) Field of Classification Search
CPC ............ G11C 11/1673; G11C 11/1655; G11C 11/4091; G11C 7/065; G11C 7/1051; G11C 7/062; G11C 11/5642; G11C 16/24; G11C 16/26; H03K 5/2481; H03K 2005/00208
See application file for complete search history.

(56) References Cited

U.S. PATENT DOCUMENTS 7,038,959 B2  5/2006  Garni
8,587,994 B2  11/2013 Kim et al.
9,384,792 B2  7/2016  Bonaccio et al.
9,697,880 B2  7/2017  Andre et al.
9,779,795 B1  10/2017 Sadd et al.
10,290,340 B1  5/2019  Jung et al.

FOREIGN PATENT DOCUMENTS

KR      101196167      11/2012

OTHER PUBLICATIONS

Lee et al., "STT-MRAM Read-Circuit With Improved Offset Cancellation," Journal of Semiconductor Technology and Science, vol. 17, No. 3, 2017, pp. 347-353.
Kang et al., "A Sense Amplifier Scheme With Offset Cancellation for Giga-Bit DRAM," Journal of Semiconductor Technology and Science, vol. 7, No. 2, 2007, pp. 67-75.

*Primary Examiner* — Ajay Ojha
(74) *Attorney, Agent, or Firm* — Gibb & Riley, LLC; Michael J. LeStrange, Esq.

(57) ABSTRACT

A sense amplifier includes, among other components, a first capacitor adapted to be charged to a precharge voltage, a complementary transistor pair (adapted to connect to the first capacitor, to a reference resistance device, and to a memory cell), a comparator adapted to connect to the complementary transistor pair, and a second capacitor adapted to connect to the comparator. The complementary transistor pair is adapted to produce a first bit voltage based on the precharge voltage and the reference resistance of the reference resistance device. The comparator is adapted to charge the second capacitor to a comparison voltage based on the first bit voltage. The complementary transistor pair is adapted to produce a cell bit voltage based on the precharge voltage and the resistance of the memory cell. The comparator is adapted to compare the cell bit voltage to the comparison voltage to produce an amplified memory cell value.

20 Claims, 7 Drawing Sheets

SENSE AMPLIFIER REUSING SAME ELEMENTS FOR EVALUATING REFERENCE DEVICE AND MEMORY CELLS

BACKGROUND

Field of the Invention

The present disclosure relates to memory devices that use sense amplifiers, and more specifically to sense amplifiers that determine and amplify memory cell values based on different measures of resistance.

Description of Related Art

Electronic memory arrays can use, for example, capacitive storage elements to store charges to represent bits of data or, in another example, memory arrays can alter the electrical resistance the memory cells. Such resistive non-volatile memory (NVM) structures provide advantages such as high speed, low power consumption, non-volatility, and low area consumption.

A magnetic random access memory (MRAM) array is an exemplary resistive NVM array. A MRAM array includes MRAM cells arranged in columns and rows. A simple MRAM cell includes a single field effect transistor (FET) (e.g., an n-type field effect transistor (NFET)) and a single variable resistor and, particularly, a single magnetic tunnel junction (MTJ). The FET and MTJ are connected in series between a source line and a bit line with the gate of the FET controlled by the state of a word line. An MTJ is a multi-layer structure and includes a fixed ferromagnetic layer (also referred to as a pinned layer) and a switchable ferromagnetic layer (also referred to as a free layer) separated by a thin dielectric layer (e.g., a thin oxide layer).

Depending upon the biasing conditions employed during a write operation, the MTJ-type variable resistor will exhibit either a low resistance (Rl) or a high resistance (Rh). More specifically, during a write operation, a high voltage (VDD) can be applied to the word line and the bit line. The source line can be connected to ground. In this case, current flows from the bit line toward the source line such that the free layer switches to (or maintains) a parallel state (also referred to as a low resistance state), thereby storing a logic value of "0" in the STT-MRAM cell. Alternatively, VDD can be applied to the word line and the source line and the bit line can be connected to ground. In this case, current flows from the source line toward the bit line such that the free layer switches to (or maintains) the anti-parallel state (also referred to as a high resistance state), thereby storing a logic value "1" in the STT-MRAM cell.

During a read operation, VDD is applied to the word line, a low positive voltage (VREAD) is applied to the bit line and the source line is connected to ground. In this case, the parallel/low resistance state (e.g., a logic "0") will be indicated by a low voltage on the bit line and an anti-parallel/high resistance state (e.g., a logic "1") will be indicated by a high voltage on the bit line. To detect whether there is a low value or a high value in the memory cell, a sense amplifier (SA) is employed to compare the voltage (Vbit) on the bit line to a comparison voltage (Vref), which is supplied by a reference cell. The reference cell is designed to generate a Vref that is between the low voltage and the high voltage; however, a mismatch between the transistors of elements that produce Vref and Vbit can produce inaccurate results. These inaccurate results can be relieved by using larger components for a multi-path circuit; however, the use of larger and slower components to introduce less mismatch resistance values increases the size, cost, power consumption, etc., and decreases operating speed.

Other resistive NVM arrays similarly include memory cells with variable resistors that can be programmed during a write operation to exhibit either a low resistance or a high resistance; however, such devices similarly suffer from sensing challenges. These other resistive NVM arrays include, for example, phase change random access memory (PCRAM) arrays and resistive random access memory (RRAM) arrays.

SUMMARY

In order to address such issues, this disclosure presents memory devices that include (among other components) a global bias circuit, a sense amplifier that is adapted to be connected to the global bias circuit, and a memory array that is that is adapted to be connected to the sense amplifier.

In greater detail, the sense amplifier includes (among other components) a first capacitor, a complementary transistor pair (that is adapted to connect to the first capacitor, to a reference resistance device within the memory array or in sense amplifier, and to a memory cell within the memory array), an amplifying comparator that is adapted to connect to the complementary transistor pair, and a second capacitor that is adapted to connect to the comparator.

Such sense amplifiers also include many switches, some of which include a global switch that is adapted to connect the first capacitor to the global bias circuit to cause the global bias circuit to charge the first capacitor to a precharge voltage, a first setting switch that is adapted to connect the first capacitor to the complementary transistor pair after the first capacitor is charged to the precharge voltage, and a multiplexor that is adapted to connect the reference resistance device to the complementary transistor pair after the first capacitor is charged to the precharge voltage. The sense amplifier also has additional switches that are adapted to precharge at least one transistor of the complementary transistor pair and at least one transistor of the comparator simultaneously while the global bias circuit is charging the first capacitor to the precharge voltage.

The complementary transistor pair is adapted to produce a first bit voltage (based on the precharge voltage and a reference resistance of the reference resistance device) when the complementary transistor pair is connected to the first capacitor and the reference resistance device. Also, a second setting switch is included in the sense amplifier. The second setting switch is adapted to connect the comparator to the second capacitor to cause the comparator to charge the second capacitor to a comparison voltage based on the first bit voltage. More specifically, the comparator also has a (second) complementary transistor pair, and the second setting switch connects one transistor of the second complementary transistor pair to the second capacitor when charging the second capacitor to the comparison voltage.

These switches are settable such that the complementary transistor pair is adapted to produce the first bit voltage simultaneously while the comparator is charging the second capacitor to the comparison voltage. The second setting switch is also adapted to disconnect the complementary transistor pair from the comparator after the second capacitor is charged to the comparison voltage.

The multiplexor is adapted to selectively disconnect the reference resistance device from the complementary transistor pair and to selectively connect one of the memory cells to the complementary transistor pair after the second capacitor is charged to the comparison voltage. When the complementary transistor pair is connected to the first capacitor and this memory cell, the complementary transistor pair is adapted to produce a cell bit voltage based on the precharge voltage and the resistance of the memory cell. The comparator is adapted to compare the cell bit voltage to the comparison voltage and amplify the result to produce an amplified memory cell value.

Once the previously mentioned (e.g., first) memory cell has been read, the multiplexor is then adapted to selectively connect the complementary transistor pair to other memory cells (e.g., a second memory cell, a third memory cell, etc.) within the memory array. The complementary transistor pair is then adapted to produce a "second" cell bit voltage based on the precharge voltage and the resistance of the second memory cell, and this occurs before the precharge voltage is discharged from the first capacitor. The comparator is similarly adapted to compare the second cell bit voltage to the comparison voltage, and amplify the result, to produce an amplified second memory cell value, also before the precharge voltage is discharged from the second capacitor. In other words, the complementary transistor pair is adapted to produce the second cell bit voltage in the same read cycle that the first cell bit voltage is produced (and before any additional cycles that recharge the first capacitor occur), and similarly the comparator is adapted to produce the amplified second memory cell value in the same read cycle that the first memory cell value is produced (and also before additional cycles that recharge the second capacitor occur).

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, resistive nonvolatile memory (NVM) structures are suitable replacements for other on-chip memory arrays because of advantages such as high speed, low power consumption, non-volatility and potentially low area consumption. However, in sense amplifiers used with such devices, a mismatch between the transistors of elements that produce reference values and memory states can produce inaccurate results. These inaccurate results can be relieved by using larger components for a multi-path circuit; however, the use of larger and slower components to introduce less mismatch resistance values can increase the size, cost, power consumption, etc., and decrease operating speed.

Figure 1:
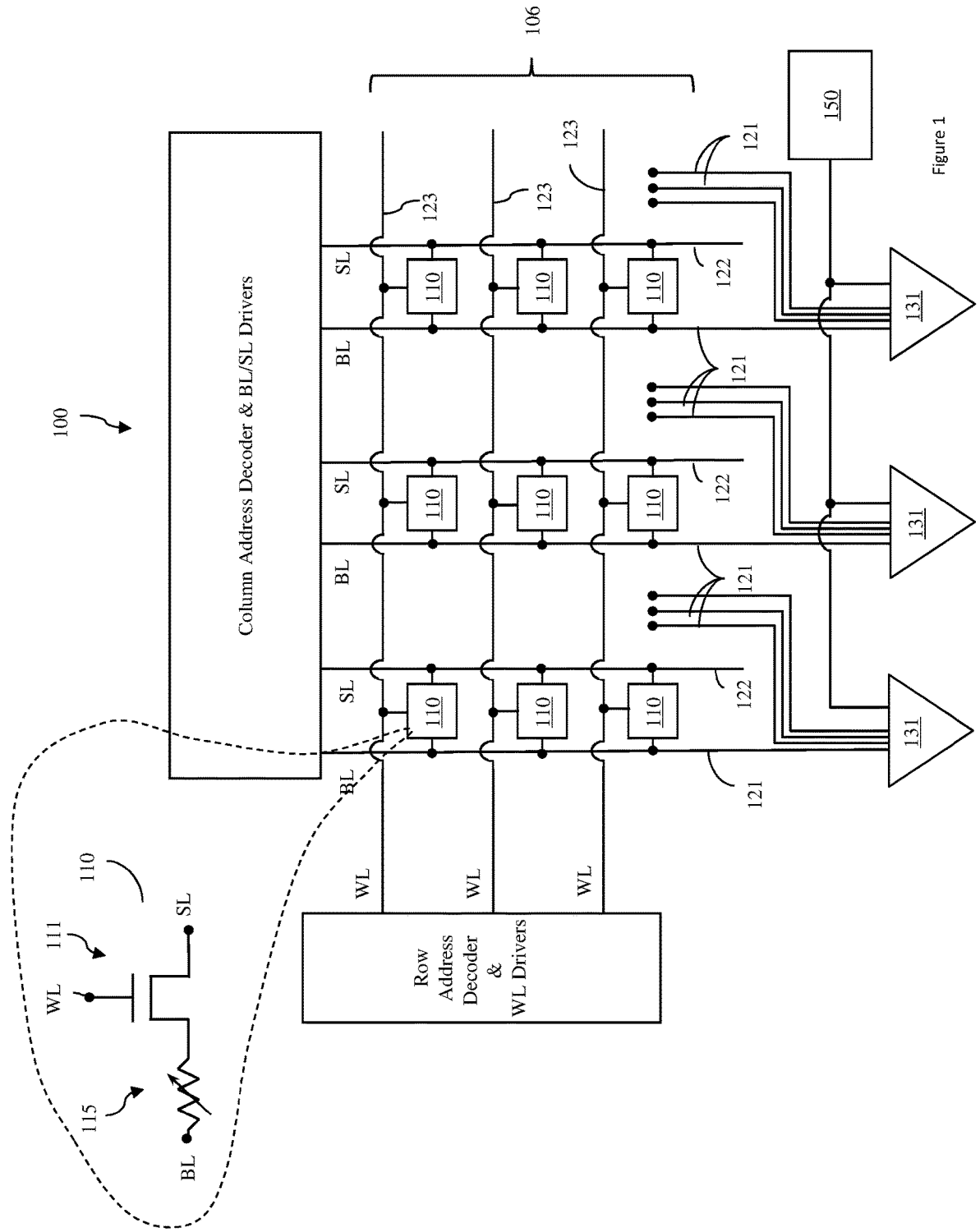
FIG. 1 is a schematic diagram illustrating a memory device having a memory array according to embodiments herein.

FIG. 1 is a schematic diagram illustrating an exemplary memory device 100 having a resistive NVM array 106 with memory cells 110 arranged in columns and rows. Each memory cell 110 can be connected in series between a source line 122 and a bit line 121. The variable resistor of each memory cell 110 can be configured to selectively exhibit either a low resistance (Rl) or a high resistance (Rh), depending upon the biasing conditions employed during a write operation. For example, the resistive NVM array 106 can be a spin transfer torque-magnetic random access memory (STT-MRAM) array and each STT-MRAM cell can include a single field effect transistor (e.g., an n-type field effect transistor (NFET)) 111 and a single magnetic tunnel junction (MTJ) 115 (which functions as a variable resistor) connected in series between the source line 122 and the bit line 121. As illustrated, all memory cells 110 in the same column are connected to the same source line 122 and the same bit line 121. Furthermore, all memory cells 110 in the same row have transistor gates controlled by the same word line 123.

Figures 2A, 2B:
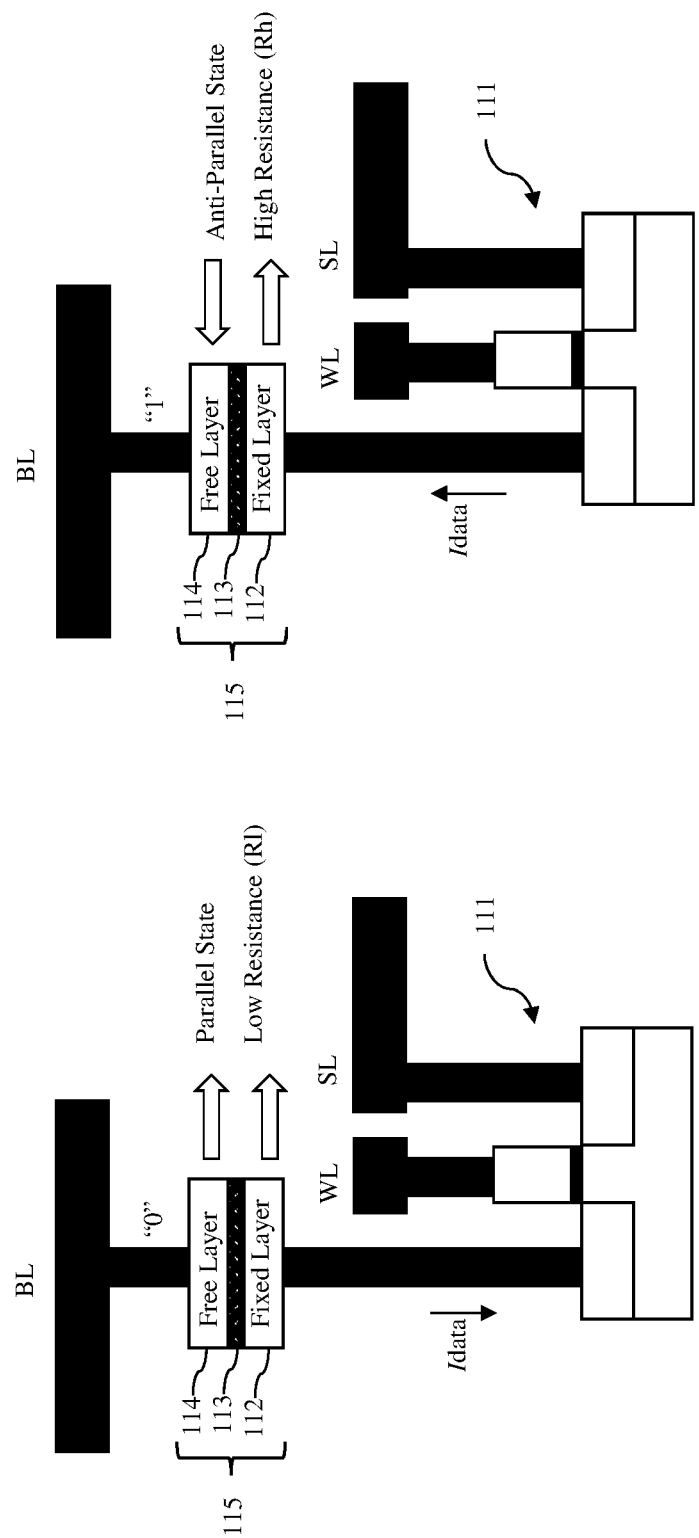
FIGS. 2A-2B are schematic diagrams illustrating memory cells according to embodiments herein.

FIGS. 2A-2B further illustrate an exemplary STT-MRAM cell 110 with the MTJ 115 in a parallel/low resistance state and in an anti-parallel/high resistance state, respectively. More particularly, referring to FIG. 1 in combination with FIGS. 2A-2B, the MTJ 115 is a multi-layer structure that includes a fixed ferromagnetic layer 112 (also referred to as a pinned layer) and a switchable ferromagnetic layer 114 (also referred to as a free layer) separated by a thin dielectric layer 113 (e.g., a thin oxide layer). During standby mode, the word line, bit line and source line are each connected to ground. During a write operation, depending upon the biasing conditions employed, the MJT can exhibit either a low resistance or a high resistance. Specifically, during a write operation, a high positive voltage (VDD) can be applied to the word line and the bit line and the source line can be connected to ground. In this case, current flows from the bit line toward the source line such that the free layer switches to (or maintains) the parallel state (also referred to as a low resistance state), thereby storing a logic value of "0" in the STT-MRAM cell (as shown in FIG. 2A).

Alternatively, VDD can be applied to the word line and the source line, and the bit line can be connected to ground. In this case, current flows from the source line toward the bit line such that the free layer switches to (or maintains) the anti-parallel state (also referred to as a high resistance state), thereby storing a logic value "1" in the STT-MRAM cell (as shown in FIG. 2B). During a read operation, VDD is applied to the word line, a relatively low read voltage (VREAD) is applied to the bit line and the source line is connected to ground. In this case, a parallel/low resistance state (e.g., a logic "0") will be indicated by a low voltage on the bit line and an anti-parallel/high resistance state (e.g., a logic "1") will be indicated by a high voltage on the bit line.

To detect whether there is a low voltage or a high voltage on the bit line, a sense amplifier (SA) 131 for each column is employed to compare the voltage (Vbit) on the bit line to a stored comparison voltage (Vref). Note that, as explained below, each of the sense amplifiers 131 is multiplexor connected to many bitlines 121 allowing each sense amplifier device 131 to determine the state of many columns of memory cells. Item 150 is a global bias device used by each of the sense amplifiers 131 to set the local bias. One global bias device 150 may serve all the sense amplifiers 131, or many global bias devices 150 may be included in the memory device.

As alluded to above, within sense amplifiers, the transistors that perform the memory state evaluation operation may often suffer from manufacturing variations, which can result in a mismatch between such transistors and a corresponding inconsistent comparison operation. Because of this, some sense amplifiers either perform elaborate calibration operations or use sizable devices to mitigate such device mismatch. However, calibration operations can slow operating speed and can require additional circuit elements. Larger devices can disadvantageously have longer bias setting and data sensing operations, slowing the sense amplifiers, increasing power consumption, increasing device size, etc.

In view of such issues, the sense amplifiers 131 within the disclosed devices reuse the same elements to evaluate the reference device and the memory cells. Thus, the sense amplifiers herein use a single sensing path (use the same circuit devices to determine the reference resistance and the data resistance). This avoids the mismatch that can occur when one path (set of components) in the sense amplifier is used to set the bias resulting from the reference resistance and a different path (different set of components) is used to calculate a bit voltage resulting from the memory cell resistance. In other words, because the same path (the exact same circuit elements) are used to perform both the bias setting and data read operations, there cannot be a mismatch between devices in different paths. This allows fewer components to be used, and such components are smaller, lower-power consumption devices that operate at higher speed.

Additionally, the devices herein set the bias of all comparator elements at the same time (again because only a single path is included in these sense amplifiers 131) which increases operating speed compared to devices that set the bias of different paths in separate operations. Further, the devices herein size the capacitors to allow multiple memory elements to be read for each bias setting operation, which increases speed and reduces power consumption by reducing the number of bias operations per data bit read.

Figure 3:
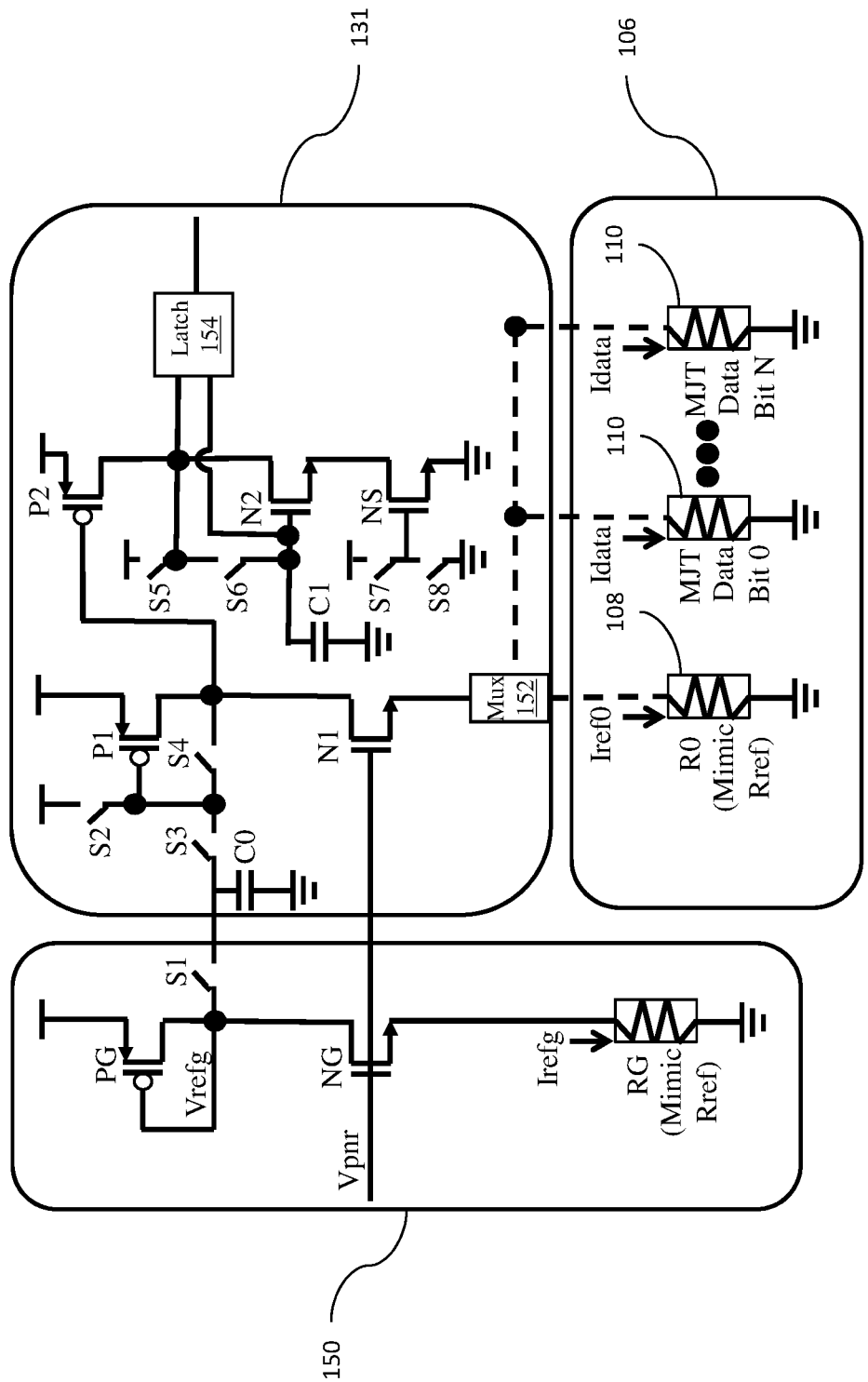
FIGS. 3-4D are schematic diagram illustrating a global bias circuit and a sense amplifier according to embodiments herein.

More specifically, FIG. 3 illustrates some relevant components of the sense amplifiers 131, global bias circuits 150, and memory arrays 106 used herein. As would be understood by those ordinarily skilled in the art, these arrangements of components are merely exemplary and the claims presented below are intended to include other arrangements, other component configurations, etc., that perform these same functions in the same manner.

Such sense amplifier devices 131 include (among other components) a first capacitor C0, a complementary transistor pair P1, N1 (that is adapted to connect to the first capacitor C0, to a reference resistance device 108 within the memory array 106, and to a memory cell 110 within the memory array 106 through a multiplexor 152), a comparator P2, N2 that is adapted to connect to the complementary transistor pair P1, N1 (and that is buffered from ground by transistor NS), and a second capacitor C1 that is adapted to connect to the comparator P2, N2.

Such sense amplifiers 131 also include many switches (some of which are shown as switches S1-S8, and all of which are shown as being open (non-conductive) in FIG. 3). For example, switches S2-S4 and S5-S8 connect the gates/bases of various transistors P1, N2, NS, etc., to voltage supplies, ground, other devices, etc. when closed (when conductive). Further, the global bias circuit 150 can include a switch S1 that connects to the sense amplifier(s) 131. These switches can be simple on/off transistors, complementary transistor pairs, diodes, etc., depending upon design choice.

Figure 4A:
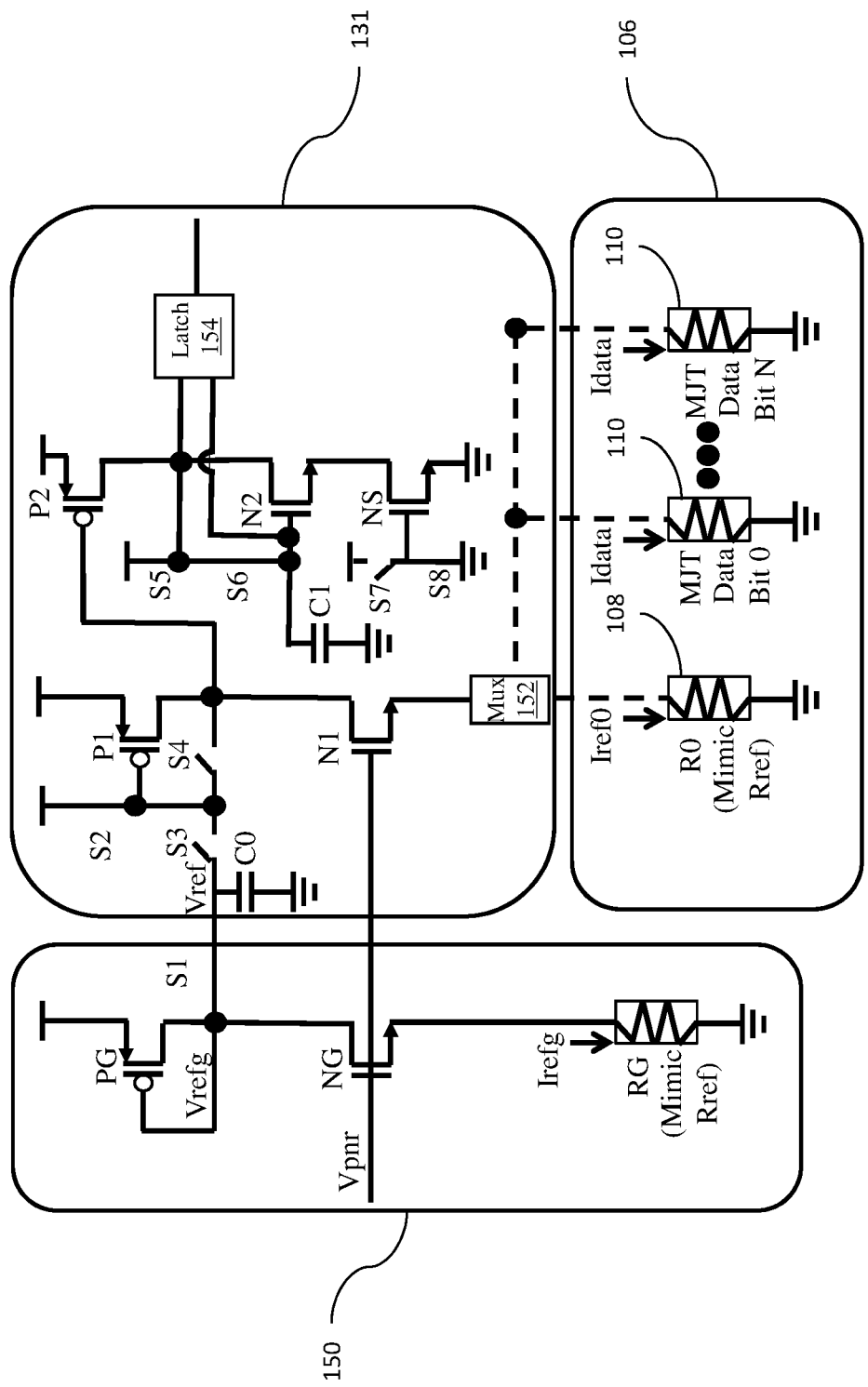

FIG. 3 also shows that the global bias circuit 150 includes a global complementary transistor pair PG, NG connected to a global resistor device RG. The global resistor device RG (in combination with a programming line Vpnr for read clamping voltage) controls the global complementary transistor pair PG, NG to provide a global reference voltage Vrefg, which is supplied to the sense amplifiers 131 when the global switch S1 is closed. As shown in FIG. 4A (which is referred to as the "idle" or "global bias setting" phase herein) when global switch S1 is closed, this connects the first capacitor C0 to the global bias circuit 150 to cause the global bias circuit 150 to charge the first capacitor C0 to a precharge voltage Vref.

Also, in the idle phase shown in FIG. 4A, various switches S2, S5, S8, etc., are closed to connect devices to voltage sources, grounds (shown symbolically) other devices, etc., to precharge at least some of the elements of at least one transistor of the complementary transistor pair P1, N1 and at least one transistor of the comparator P2, N2 simultaneously while the global bias circuit 150 is charging the first capacitor C0 to the precharge voltage Vref. The time taken is sufficient to create sufficient charge to permit the following operations.

Figure 4B:
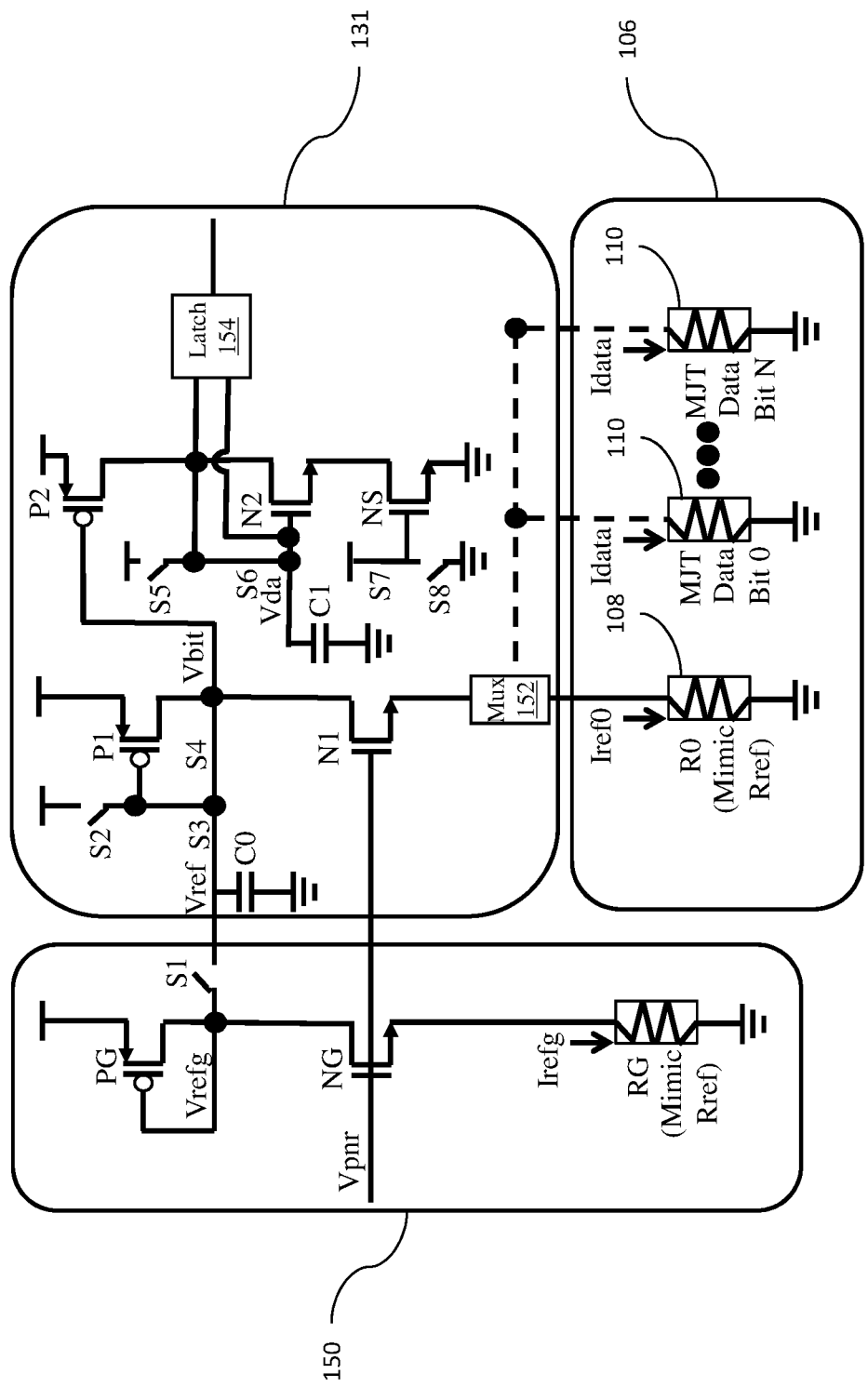

As shown in FIG. 4B (which is referred to as the local bias setting phase herein) after the first capacitor C0 is charged to the precharge voltage Vref, the various precharge switches e.g., S1, S2, S5, S8, etc., are opened, first setting switches S3, S4 are closed to connect the first capacitor C0 to the complementary transistor pair P1, N1, and to the multiplexor 152. This connects the complementary transistor pair P1, N1 to the reference resistance device 108. While the reference resistance device 108 is shown as being a component of the memory array 106, it could alternatively be a component of the sense amplifier device 131. Note that in the accompanying figures, the broken-line connections to the multiplexor 152 show connections that are possible, but that are not made by the multiplexor 152.

Connected in this manner, the complementary transistor pair P1, N1 is adapted to produce a first bit voltage Vbit based on the precharge voltage Vref and the reference resistance R0 of the reference resistance device 108. The first bit voltage Vbit is a known quantity because the reference resistance R0, the voltage, ground, and the programming line Vpnr are known quantities, even if the characteristics of transistors P1, N1 and the connecting wiring are unknown. Therefore, the reaction of other components within the sense amplifier device 131 to the first bit voltage Vbit can also be used as known quantities.

Second setting switch(es) S5, S6 are also included in the sense amplifier device 131. The second setting switches S5 S6 are adapted to connect at least portion of the comparator P2, N2 to the second capacitor C1 to cause the comparator P2, N2 to charge the second capacitor C1 to a comparison voltage Vda based on the first bit voltage Vbit. More specifically, the comparator P2, N2 also has a (second) complementary transistor pair P2, N2, and the second setting switch S6 connects the drain of one transistor (precharged transistor P2) of the second complementary transistor pair P2, N2 to the second capacitor C1 when charging the second capacitor C1 to the comparison voltage Vda.

Here the drain of transistor P2 outputs the comparison voltage Vda when the first bit voltage Vbit is applied to the gate of transistor P2 because the gate of transistor P2 has been sufficiently precharged during the idle phase shown in FIG. 4A. As noted above, the first bit voltage Vbit is a known quantity because it is based on known values (e.g., reference resistance R0, high voltage, ground, programming line Vpnr, etc.) and this allows the comparison voltage Vda to also be a known quantity that can be used (as described in greater detail below) by the comparator P2, N2 to determine (through comparison with Vda) the state of unknown resistances of the memory cells 110.

Further, these switches S1-S8 are settable such that the complementary transistor pair P1, N1 is adapted to produce the first bit voltage Vbit simultaneously while the comparator P2, N2 is charging the second capacitor C1 to the comparison voltage Vda. Thus, all switches can be set and held as shown in FIG. 4B for a sufficient time to allow the second capacitor C1 to attain the comparison voltage Vda. The second setting switch S6 is also adapted to disconnect the transistor P2 from the capacitor C1 after the second capacitor C1 is charged to the comparison voltage Vda.

Figure 4C:
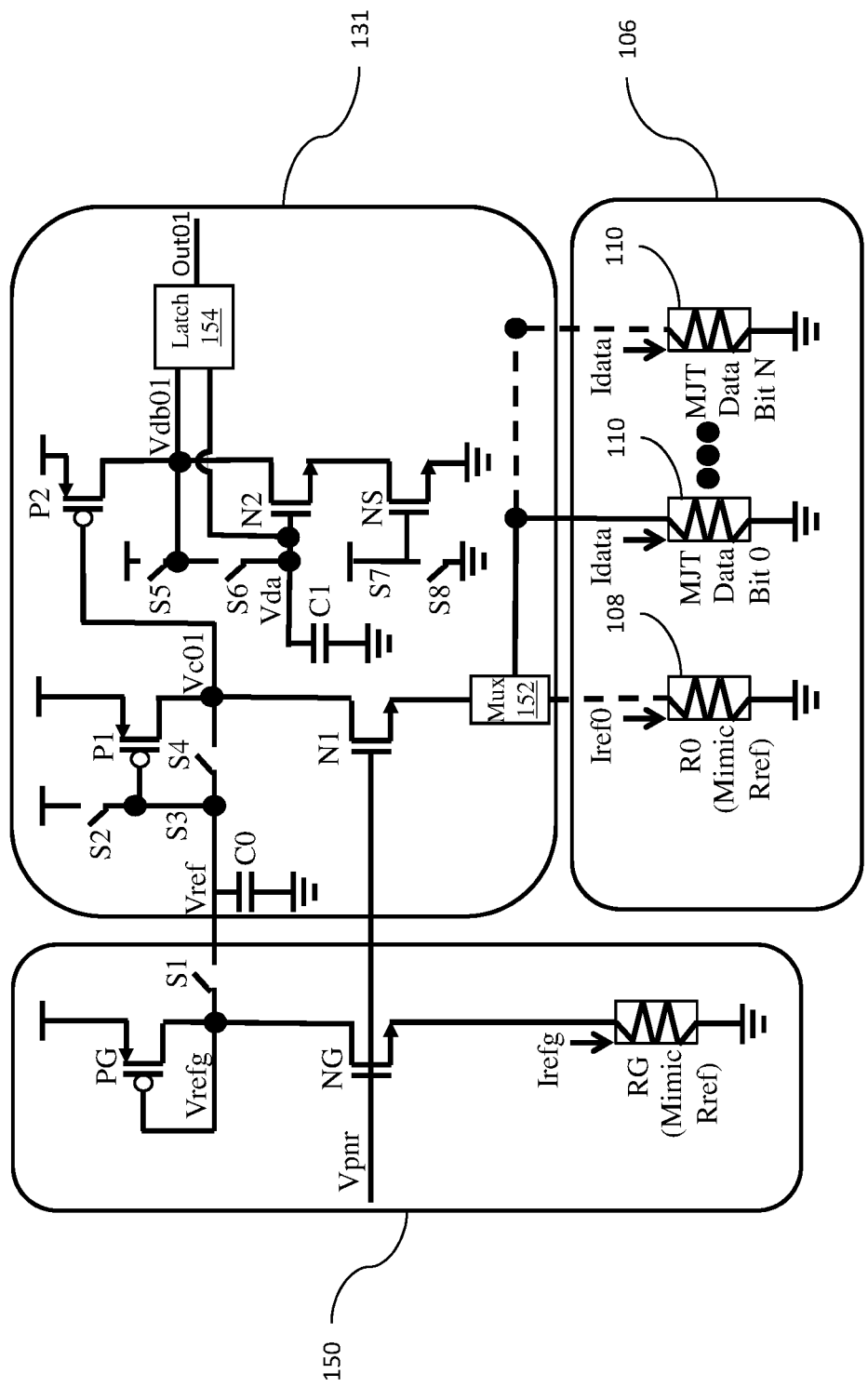

FIG. 4C illustrates what is referred to herein as the local sensing phase. In the local sensing phase, the multiplexor 152 selectively disconnects the reference resistance device 108 from the complementary transistor pair P1, N1 and selectively connects one of the memory cells 110 to the complementary transistor pair P1, N1 (again, this occurs after the second capacitor C1 is charged to the comparison voltage Vda).

When the complementary transistor pair P1, N1 is connected to the first capacitor C0 and the memory cell 110, the complementary transistor pair P1, N1 is adapted to produce a cell bit voltage Vc01 based on the precharge voltage Vref in the first capacitor C0 and the resistance of the memory cell 110. These connections are therefore identical to the connections that produced the first bit voltage Vbit, except that the resistance of the memory cell 110 is unknown, while previously when producing the first bit voltage Vbit the reference resistance R0 of the resistance device 108 was known. Therefore, cell bit voltage Vc01 may be the same as the first bit voltage Vbit, or may be different; and any difference can show that the resistance of the memory cell 110 is different from (e.g., higher or lower than) the known reference resistance R0, allowing the state of the memory cell 110 to be determined.

Also, in the local sensing phase shown in FIG. 4C, the cell bit voltage Vc01 is applied to the gate of one of the transistors (P2) of the comparator P2, N2, using the exact connections used when the first bit voltage Vbit was applied to the gate of transistor P2 to produce the comparison voltage Vda. This allows the output of the drain of transistor P2 to be compared to the comparison voltage Vda stored in the second capacitor C1, which is connected in this local sensing phase to be applied to the gate of the complementary transistor N2 within the comparator P2, N2.

Therefore, the comparator P2, N2 is adapted to compare the cell bit voltage Vc01 (applied to transistor P2) to the comparison voltage Vda (applied to transistor N2) and amplify the result to produce an amplified memory cell value Vdb01. Depending upon whether the cell bit voltage Vc01 is higher or lower than the comparison voltage Vda, the amplified cell value Vdb01 will be a voltage representing a 0 or a 1. Further, the voltage applied to the sources/drains of the transistors of the comparator P2, N2 allows the comparator to amplify the output Vdb01 relative to the voltage of the cell bit voltage Vc01.

A useful feature of this sense amplifier device 131 is that the exact same circuit components/elements are used to evaluate the resistance of the reference device R0 and the resistance of the memory cell 110. Therefore, even if the characteristics of such components/elements (transistors, connecting wires, etc.) are not fully known or are unknown, because the same components/elements are used to generate both the comparison voltage Vda and the cell bit voltage Vc01, there can be no device component/element mismatch which can skew the comparison. This avoids the mismatch that can occur when one path (set of components) in the sense amplifier is used to set the bias resulting from the reference resistance and a different path (different set of components) is used to calculate a bit voltage resulting from the memory cell resistance. In other words, because the same path (the exact same circuit elements) are used to perform both the bias setting and data read operations, there cannot be a mismatch between devices in different paths. This allows the resistance differences that are measured to be very small, allowing smaller, faster, lower-power consumption components to be used in the memory array 106 and the sense amplifier device 131.

The result of the comparison can be output to a storage device, such as a differential latch 154. In FIG. 4C, amplified cell value Vdb01 that was based on the cell bit voltage Vc01 is shown as value Out01. Additional memory cells 110 in the memory array 106 are similarly sequentially sensed, one at a time, as shown for example in FIG. 4D.

Figure 4D:
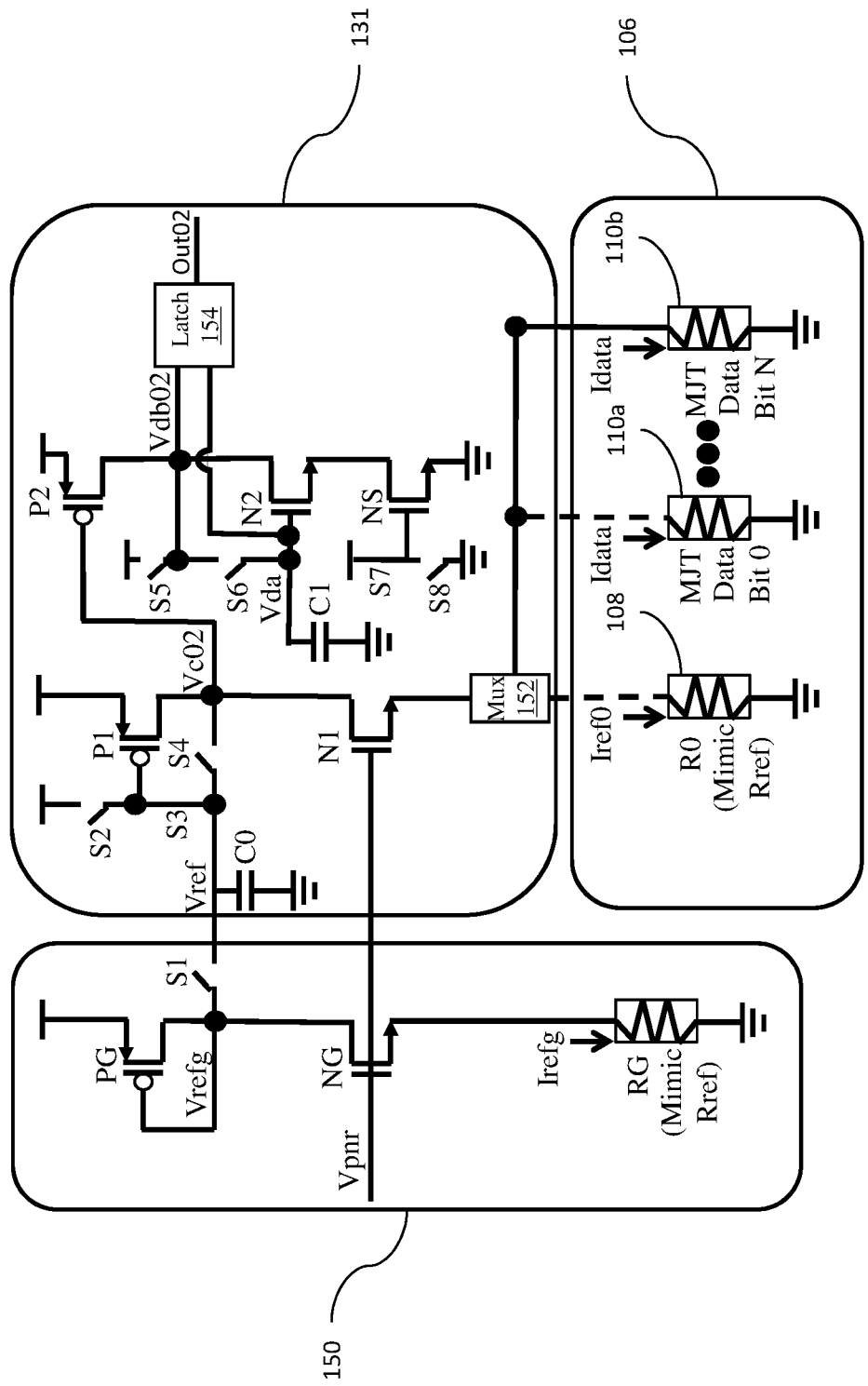

Therefore, as shown in FIG. 4D, once the previously mentioned (e.g., first) memory cell 110a has been read, the multiplexor 152 is then adapted to selectively connect the complementary transistor pair P1, N1 to another memory cell (e.g., a second memory cell 110b) within the memory array 106 (from Bit0 to BitN). The complementary transistor pair P1, N1 is then adapted to produce a second cell bit voltage Vc02 based on the precharge voltage Vref and the resistance of the second memory cell 110b, and this occurs before the precharge voltage Vref is discharged from the first capacitor C0 or the comparison voltage Vda is discharged from the second capacitor C1. The comparator P2, N2 is similarly adapted to compare the second cell bit voltage Vc02 to the comparison voltage Vda to produce an amplified second memory cell value Vdb02, which is also saved in the latch 154 as Out02.

Because multiple memory cells 110a, 110b are evaluated before the capacitors C0, C1 are discharged, the complementary transistor pair P1, N1 is adapted to produce the second cell bit voltage Vc02 in the same read cycle that the first cell bit voltage Vc01 is produced (and before any additional cycles that recharge the first capacitor C0 occur). Similarly, the comparator P2, N2 is adapted to produce the amplified second memory cell value 02 in the same read cycle that the first memory cell value 01 is produced (and also before additional cycles that recharge the second capacitor C1 occur). Thus, the devices herein size the capacitors C0, C1 to allow multiple memory elements 110 to be read for each bias setting operation, which increases speed and reduces power consumption by reducing the number of bias operations per data bit read.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The block diagrams in the figures illustrate the architecture, functionality, and operation of possible implementations of devices and methods according to various embodiments. In this regard, each block in the block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams illustration, and combinations of blocks in the block diagrams illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements).

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A sense amplifier comprising:
   a first capacitor adapted to be charged to a precharge voltage;
   a complementary transistor pair adapted to connect to the first capacitor, to a reference resistance device, and to a memory cell;
   a comparator adapted to connect to the complementary transistor pair; and
   a second capacitor adapted to connect to the comparator,
   wherein the complementary transistor pair is adapted to produce a first bit voltage based on the precharge voltage and a reference resistance of the reference resistance device,
   wherein the comparator is adapted to charge the second capacitor to a comparison voltage based on the first bit voltage,
   wherein the complementary transistor pair is adapted to produce a cell bit voltage based on the precharge voltage and a resistance of the memory cell, and
   wherein the comparator is adapted to compare the cell bit voltage to the comparison voltage to produce an amplified memory cell value.

2. The sense amplifier according to claim 1, further comprising a multiplexor adapted to connect the reference resistance device to the complementary transistor pair,
   wherein the multiplexor is adapted to selectively connect the complementary transistor pair to a second memory cell,
   wherein the complementary transistor pair is adapted to produce a second cell bit voltage based on the precharge voltage and a resistance of the second memory cell before the precharge voltage is discharged from the first capacitor, and
   wherein the comparator is adapted to compare the second cell bit voltage to the comparison voltage to produce an amplified second memory cell value before the precharge voltage is discharged from the second capacitor.

3. The sense amplifier according to claim 2, wherein the complementary transistor pair is adapted to produce the second cell bit voltage in a same read cycle that the cell bit voltage is produced and before additional cycles that recharge the first capacitor, and
   wherein the comparator is adapted to produce the amplified second memory cell value in the same read cycle that the memory cell value is produced and before additional cycles that recharge the second capacitor.

4. The sense amplifier according to claim 1, wherein the complementary transistor pair is adapted to produce a first bit voltage simultaneously while the comparator is charging the second capacitor to the comparison voltage.

5. The sense amplifier according to claim 1, further comprising switches adapted to precharge at least one transistor of the complementary transistor pair and at least one transistor of the comparator simultaneously while a global bias circuit is charging the first capacitor to the precharge voltage.

6. The sense amplifier according to claim 1, wherein a second setting switch is adapted to disconnect the comparator from the second capacitor after the second capacitor is charged to the comparison voltage.

7. The sense amplifier according to claim 1, wherein the comparator comprises a second complementary transistor pair, and
wherein a second setting switch connects one transistor of the second complementary transistor pair to the second capacitor when charging the second capacitor to the comparison voltage.

8. A sense amplifier comprising:
a first capacitor;
a complementary transistor pair adapted to connect to the first capacitor, to a reference resistance device, and to a memory cell;
a comparator adapted to connect to the complementary transistor pair;
a second capacitor adapted to connect to the comparator;
a global switch adapted to connect the first capacitor to a global bias circuit to cause the global bias circuit to charge the first capacitor to a precharge voltage;
a first setting switch adapted to connect the first capacitor to the complementary transistor pair after the first capacitor is charged to the precharge voltage;
a multiplexor adapted to connect the reference resistance device to the complementary transistor pair after the first capacitor is charged to the precharge voltage, wherein the complementary transistor pair is adapted to produce a first bit voltage based on the precharge voltage and a reference resistance of the reference resistance device when the complementary transistor pair is connected to the first capacitor and the reference resistance device; and
a second setting switch adapted to connect the comparator to the second capacitor to cause the comparator to charge the second capacitor to a comparison voltage based on the first bit voltage,
wherein the multiplexor is adapted to selectively disconnect the reference resistance device from the complementary transistor pair and to selectively connect the memory cell to the complementary transistor pair after the second capacitor is charged to the comparison voltage,
wherein the complementary transistor pair is adapted to produce a cell bit voltage based on the precharge voltage and a resistance of the memory cell when the complementary transistor pair is connected to the first capacitor and the memory cell, and
wherein the comparator is adapted to compare the cell bit voltage to the comparison voltage to produce an amplified memory cell value.

9. The sense amplifier according to claim 8, wherein the multiplexor is adapted to selectively connect the complementary transistor pair to a second memory cell,
wherein the complementary transistor pair is adapted to produce a second cell bit voltage based on the precharge voltage and a resistance of the second memory cell before the precharge voltage is discharged from the first capacitor, and
wherein the comparator is adapted to compare the second cell bit voltage to the comparison voltage to produce an amplified second memory cell value before the precharge voltage is discharged from the second capacitor.

10. The sense amplifier according to claim 9, wherein the complementary transistor pair is adapted to produce the second cell bit voltage in a same read cycle that the cell bit voltage is produced and before additional cycles that recharge the first capacitor, and
wherein the comparator is adapted to produce the amplified second memory cell value in the same read cycle that the memory cell value is produced and before additional cycles that recharge the second capacitor.

11. The sense amplifier according to claim 8, wherein the complementary transistor pair is adapted to produce a first bit voltage simultaneously while the comparator is charging the second capacitor to the comparison voltage.

12. The sense amplifier according to claim 8, further comprising additional switches adapted to precharge at least one transistor of the complementary transistor pair and at least one transistor of the comparator simultaneously while the global bias circuit is charging the first capacitor to the precharge voltage.

13. The sense amplifier according to claim 8, wherein the second setting switch is adapted to disconnect the comparator from the second capacitor after the second capacitor is charged to the comparison voltage.

14. The sense amplifier according to claim 8, wherein the comparator comprises a second complementary transistor pair, and
wherein the second setting switch connects one transistor of the second complementary transistor pair to the second capacitor when charging the second capacitor to the comparison voltage.

15. A memory device comprising:
a global bias circuit;
a sense amplifier adapted to be connected to the global bias circuit; and
a memory array adapted to be connected to the sense amplifier, wherein the sense amplifier comprises:
a first capacitor;
a complementary transistor pair adapted to connect to the first capacitor, to a reference resistance device within the memory array, and to a memory cell within the memory array;
a comparator adapted to connect to the complementary transistor pair;
a second capacitor adapted to connect to the comparator;
a global switch adapted to connect the first capacitor to the global bias circuit to cause the global bias circuit to charge the first capacitor to a precharge voltage;
a first setting switch adapted to connect the first capacitor to the complementary transistor pair after the first capacitor is charged to the precharge voltage;
a multiplexor adapted to connect the reference resistance device to the complementary transistor pair after the first capacitor is charged to the precharge voltage,
wherein the complementary transistor pair is adapted to produce a first bit voltage based on the precharge voltage and a reference resistance of the reference resistance device when the complementary transistor pair is connected to the first capacitor and the reference resistance device; and a second setting switch adapted to connect the comparator to the second capacitor to cause the comparator to charge the second capacitor to a comparison voltage based on the first bit voltage, wherein the multiplexor is adapted to selectively disconnect the reference resistance device from the complementary transistor pair and to selectively connect the memory cell to the complementary transistor pair after the second capacitor is charged to the comparison voltage, wherein the complementary transistor pair is adapted to produce a cell bit voltage based on the precharge voltage and a resistance of the memory cell when the complementary transistor pair is connected to the first capacitor and the memory cell, and wherein the comparator is adapted to compare the cell bit voltage to the comparison voltage to produce an amplified memory cell value.

16. The memory device according to claim 15, wherein the multiplexor is adapted to selectively connect the complementary transistor pair to a second memory cell within the memory array, wherein the complementary transistor pair is adapted to produce a second cell bit voltage based on the precharge voltage and a resistance of the second memory cell before the precharge voltage is discharged from the first capacitor, and wherein the comparator is adapted to compare the second cell bit voltage to the comparison voltage to produce an amplified second memory cell value before the precharge voltage is discharged from the second capacitor.

17. The memory device according to claim 16, wherein the complementary transistor pair is adapted to produce the second cell bit voltage in a same read cycle that the cell bit voltage is produced and before additional cycles that recharge the first capacitor, and wherein the comparator is adapted to produce the amplified second memory cell value in the same read cycle that the memory cell value is produced and before additional cycles that recharge the second capacitor.

18. The memory device according to claim 15, wherein the complementary transistor pair is adapted to produce a first bit voltage simultaneously while the comparator is charging the second capacitor to the comparison voltage.

19. The memory device according to claim 15, wherein the sense amplifier further comprises additional switches adapted to precharge at least one transistor of the complementary transistor pair and at least one transistor of the comparator simultaneously while the global bias circuit is charging the first capacitor to the precharge voltage.

20. The memory device according to claim 15, wherein the second setting switch is adapted to disconnect the comparator from the second capacitor after the second capacitor is charged to the comparison voltage.

* * * * *